(12) United States Patent
Sem et al.

(10) Patent No.: US 6,979,531 B2
(45) Date of Patent: Dec. 27, 2005

(54) SEA-TROSY AND RELATED METHODS

(75) Inventors: Daniel S. Sem, San Diego, CA (US); Maurizio Pellecchia, San Diego, CA (US)

(73) Assignee: Triad Therapeutics, Inc., San Diego, CA (US)

( * ) Notice: Subject to any disclaimer, the term of this patent is extended or adjusted under 35 U.S.C. 154(b) by 471 days.

(21) Appl. No.: 10/032,140

(22) Filed: Dec. 19, 2001

(65) Prior Publication Data
US 2002/0127731 A1 Sep. 12, 2002

Related U.S. Application Data
(60) Provisional application No. 60/263,475, filed on Jan. 22, 2001, and provisional application No. 60/258,621, filed on Dec. 21, 2000.

(51) Int. Cl.[7] ................................................. C12Q 1/00
(52) U.S. Cl. ........................... 435/4; 324/307; 324/309; 324/200; 435/7.1
(58) Field of Search .......................... 435/7.1, 6, 4, 7.4; 324/309, 307, 300, 200, 201, 205; 436/173

(56) References Cited

U.S. PATENT DOCUMENTS

| | | | | |
|---|---|---|---|---|
| 5,050,609 A | * | 9/1991 | Balaban et al. ............. | 600/410 |
| 5,633,584 A | * | 5/1997 | Maryanskl et al. .......... | 324/300 |
| 5,804,390 A | * | 9/1998 | Fesik et al. ................... | 435/7.1 |
| 5,926,023 A | | 7/1999 | De Groot et al. ........... | 324/309 |
| 6,043,024 A | * | 3/2000 | Fesik et al. .................... | 435/4 |
| 6,133,736 A | | 10/2000 | Pervushin et al. ........... | 324/307 |
| 6,333,149 B1 | * | 12/2001 | Sem ............................... | 435/4 |
| 6,620,589 B1 | * | 9/2003 | Sem et al. .................... | 435/7.1 |

OTHER PUBLICATIONS

Xu et al. A Catalytic Role for Protic Solvents in Conformational Interconversion. J. Am. Chem. Soc. 1996, V. 118, pp. 9176–9177.*
Kaufman et al. Nuclear Magnetic Resonance Imaging in Medicine. Igaku–Shoin, New York, 1982, pp. 11–29.*
Bax et al. Methodological Advances in Protein NMR, Accounts of Chemical Research, the American Chemical Society, 1993, V.26, No. 4, pp. 131–138.*

(Continued)

*Primary Examiner*—Long V. Le
*Assistant Examiner*—Melanie Yu
(74) *Attorney, Agent, or Firm*—McDermott Will & Emery LLP

(57) ABSTRACT

A method for preferentially observing an exposed position (1c) of a macromolecule. A sample is obtained having a macromolecule (1a) with a first proton (1) and a second molecule (2a) with a second proton (2); then applying a magnetic field (4) to the sample and irradiating the sample with a pulse sequence (5) that preferentially demagnetizes protons of the macromolecule (1, 3) relative to the second proton (2); allowing the second proton (2) to exchange (6) with an exposed proton (1) of the macromolecule; and detecting the magnetization from the relatively magnetized second proton (2), which is now bound to the exposed position (1c) of the macromolecule. The invention also provides a method for observing a position in the macromolecule that bind a ligand.

47 Claims, 8 Drawing Sheets

OTHER PUBLICATIONS

Ohno et al. NMR structure of the Streptomyces Metalloproteinase Inhibitor, SMPI, Isolated from *Streptomyces nigrescens* TK–23, 1998, V. 282, pp. 421–433.*

Bai et al., "Primary Structure Effects on Peptide Group Hydrogen Exchange," *Prot. Struct. Funct. Genet.*, 17:75–86 (1993).

Breeze, A., "Isotope–filtered NMR methods for the study of biomolecular structure and interactions," *Prog. Nucl. Magn. Res. Spect.*, 36:323–372 (2000).

Dalvit et al., "Identification of compounds with binding affinity to proteins via magnetization transfer from bulk water," *J. Biomol. NMR*, 18:65–68 (2000).

Dalvit and Hommel, "Sensitivity–Improved Detection of Protein Hydration and Its Extension to the Assignment of Fast–Exchanging Resonances," *J. Magn. Reson.*, 109:334–338 (1995).

Finucane and Jardetzky, "Mechanism of Hydrogen–Deuterium Exchange in trp Repressor Studied by $^1$H–$^{15}$N NMR," *J. Mol. Biol.*, 253:576–589 (1995).

Geen and Freeman, "Band–Selective Radiofrequency Pulses," *J. Magn. Reson.*, 93:93–141 (1991).

Gemmecker et al., "Measurement of Fast Proton Exchange Rates in Isotopically Labeled Compounds," *J. Am. Chem. Soc.*, 115:11620–11621 (1993).

Hodson and Cistola, "Ligand Binding Alters the Backbone Mobility of Intestinal Fatty Acid–Binding Protein as Monitored by $^{15}$N NMR Relaxation and $^1$H Exchange," *Biochemistry*, 36:2278–2290 (1997).

Koide et al., "Measurement of intrinsic exchange rates or amide protons in a $^{15}$N–labeled peptide," *Journal of Biomolecular NMR*, 6:306–312 (1995).

La Mar et al., "$^1$H NMR Investigation of the Influence of Interacting Sites on the Dynamics and Thermodynamics of Substrate and Ligand Binding to Horseradish Peroxidase," *Biochemistry*, 31:9158–9168 (1992).

Marion et al., "Rapid Recording of 2D NMR Spectra without Phase Cycling. Application to the Study of Hydrogen Exchange in Proteins," *J. Magn. Reson.*, 85:393–399 (1989).

Mori et al., "Water Exchange Filter (WEX Filter) for Nuclear Magnetic Resonance Studies of Macromolecules," *J. Am. Chem. Soc.*, 116:11982–11984 (1994).

Otting and Wüthrich, "Heteronuclear filters in two–dimensional [$^1$H,$^1$H]—NMR spectroscopy: combined use with isotope labelling for studies of macromolecular conformation and intermolecular interactions," *Quart. Rev. Biophys.*, 23(1):39–96 (1990).

Pellechia et al., "Pilus chaperone FimC–adhesin FimH interactions mapped by TROSY–NMR," *Nature Structural Biology*, 6(4):336–339 (1999).

Pellecchia et al., "SEA–TROSY (Solvent Exposed Amides with TROSY): A Method to Resolve the Problem of Spectral Overlap in Very Large Proteins," *J. Am. Chem. Soc.*, 123:4633–4634 (2001).

Pervushin et al., "Attenuated $T_2$ relaxation by mutual cancellation of dipole–dipole coupling and chemical shift anisotropy indicates an avenue to NMR structures of very large biological macromolecules in solution," *Proc. Natl. Acad. Sci.*, 94:12366–12371 (1997).

Pervushin et al., "Single transition–to–single transition polarization transfer (ST2–PT) in [$^{15}$N,$^1$H]–TROSY," *J. Biomol. NMR*, 12:345–348 (1998).

Salzmann et al., "TROSY in triple–resonance experiments: New perspectives for sequential NMR assignment of large proteins," *Proc. Natl. Acad. Sci.*, 95:13585–13590 (1998).

Shaka et al., "An Improved Sequence for Broadband Decoupling: WALTZ–16," *J. Magn. Reson.*, 52:335–338 (1983).

Sklenář et al., "Gradient–Tailored Water Suppression for $^1$H–$^{15}$N HSQC Experiments Optimized to Retain Full Sensitivity," *J. Magn. Reson.*, 102:241–245 (1993).

Wider and Wüthrich, "NMR spectroscopy of large molecules and multimolecular assemblies in solution," *Cur. Opin. Struct. Biol.*, 9:594–601 (1999).

Zangger and Armitage, "Sensitivity–Enhanced Detection of Fast Exchanging Protons by an Exchange–Edited Gradient HEHAHA–HSQC Equipment," *J. Magn. Reson.*, 135:70–75 (1998).

* cited by examiner

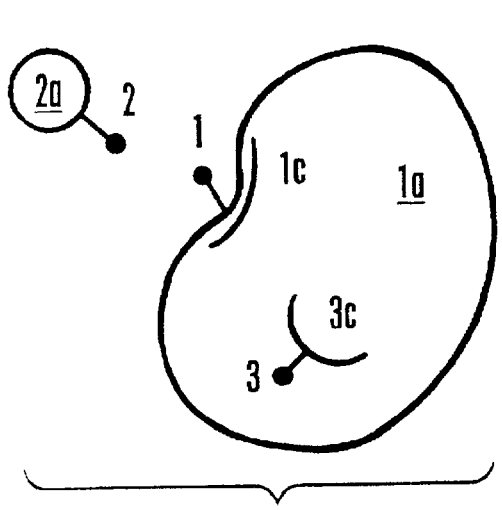
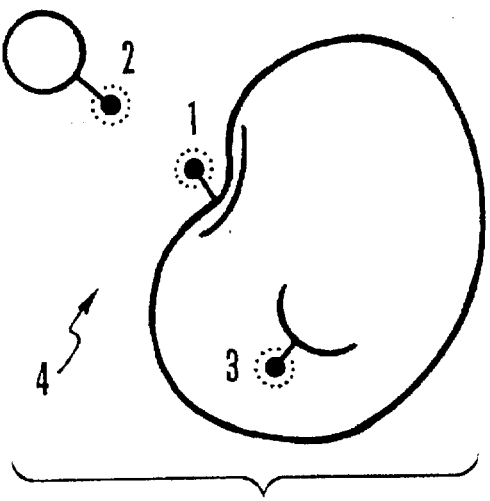
Fig. 1A  Fig. 1B
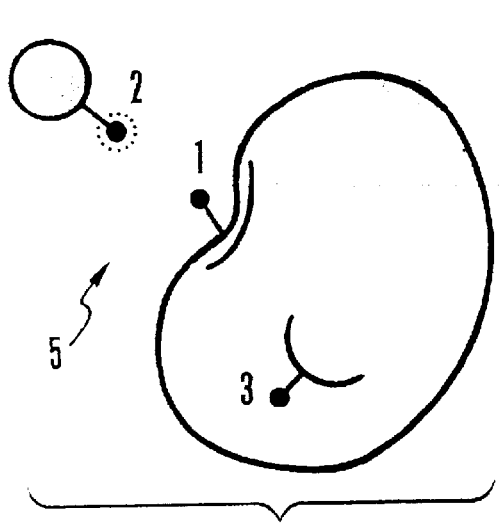
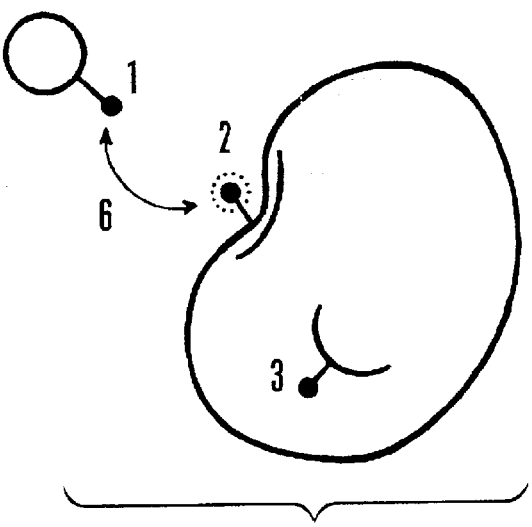
Fig. 1C  Fig. 1D
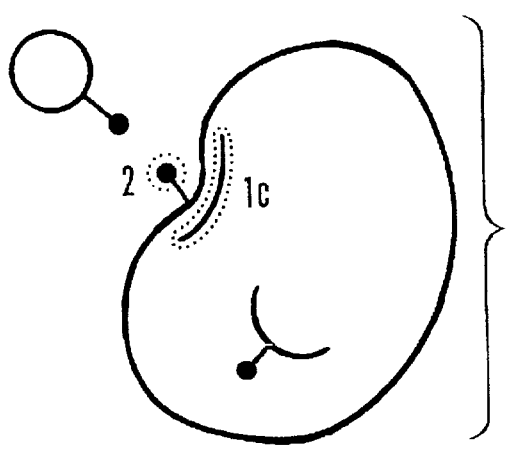
Fig. 1E

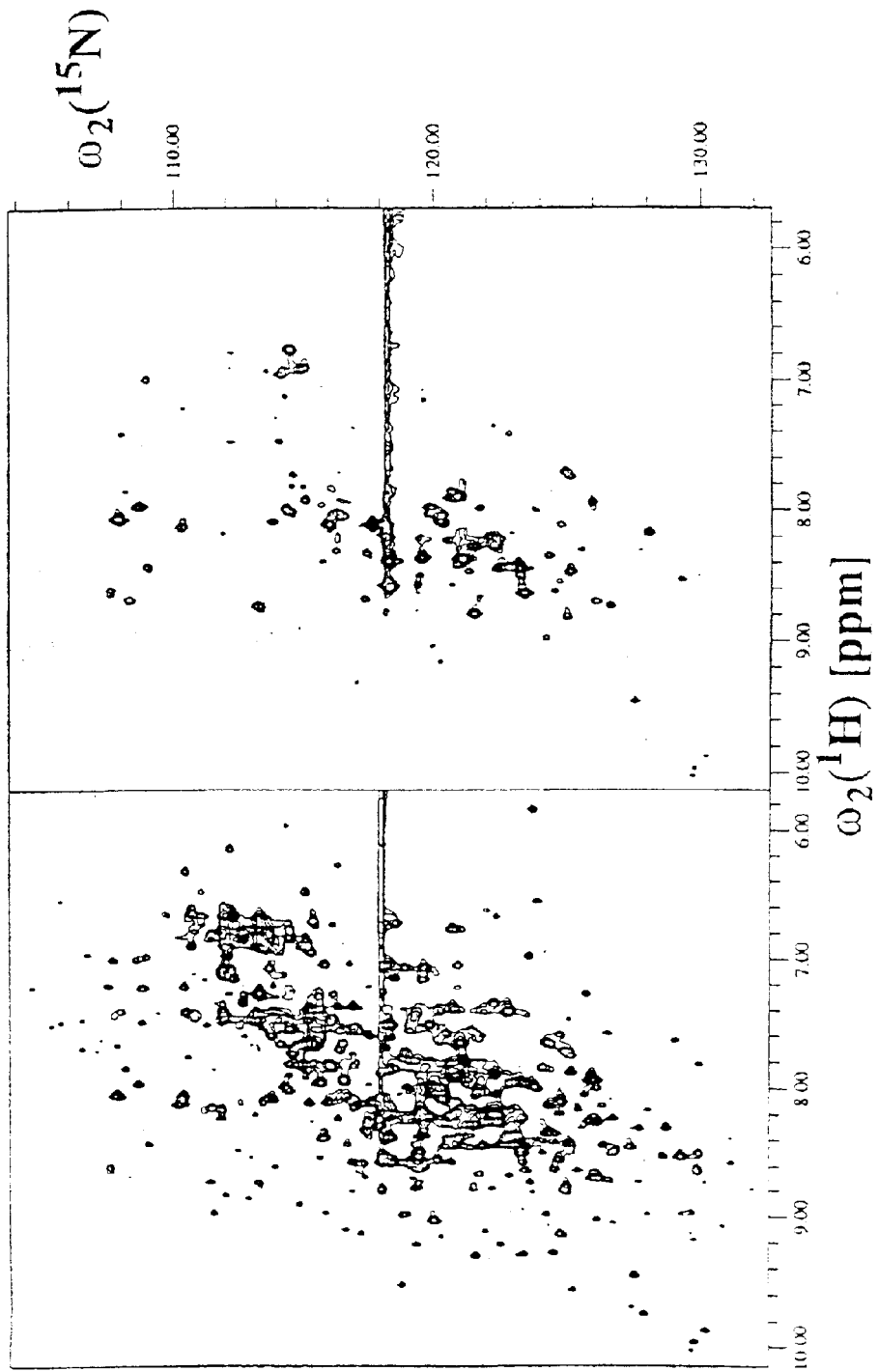

US 6,979,531 B2

SEA-TROSY AND RELATED METHODS

This application is based on and claims benefit of U.S. Provisional Application No. 60/258,621, filed Dec. 21, 2000, and U.S. Provisional Application No. 60/263,475, filed Jan. 22, 2001, both of which are incorporated herein by reference.

BACKGROUND OF THE INVENTION

This invention relates broadly to the structure of macromolecules and more specifically to nuclear magnetic resonance (NMR) methods for preferentially observing exposed positions of a macromolecule.

The three-dimensional structure of macromolecules such as proteins can provide insight into their function in normal and diseased cells. For example, when certain compounds or "ligands" bind to a protein, the 3-D structure of the protein can help identify the ligand's binding sites on the protein. Atomic-resolution structures can allow researchers to understand the interaction between ligands and macromolecules and to design and select new ligands that may serve as therapeutic drugs.

Nuclear magnetic resonance (NMR) spectroscopy has determined the structure of many proteins at atomic resolution. Nevertheless, current NMR methods for protein structure determination are extremely time-consuming because they require painstaking deduction of the positions of thousands of individual atoms. As attention focuses on larger and more complex proteins and the number of atoms increases, the data generated by NMR methods can become overwhelming, making it virtually impossible to determine the structure of the protein.

Thus, there is a need for methods that can provide information about large macromolecular structures in a way that is useful for understanding ligand binding. The present invention satisfies this need and provides related advantages as well.

BRIEF SUMMARY OF THE INVENTION

The invention provides a method for preferentially observing an exposed position of a macromolecule. The method includes the steps of (a) obtaining a sample including a macromolecule and a second molecule, wherein the macromolecule is larger than 35 kiloDaltons and has a position that is exposed to the second molecule, wherein a first proton is bound to the exposed position of the macromolecule, a second proton is bound to the second molecule, and the first proton can exchange with the second proton; (b) applying a magnetic field to the sample, thereby magnetizing the first proton and the second proton; (c) irradiating the sample with a pulse sequence that preferentially demagnetizes the protons of the macromolecule relative to the second proton; (d) allowing the second proton to exchange with the first proton, whereby the relatively magnetized second proton becomes bound to the exposed position of the macromolecule; and (e) detecting the magnetization from the second proton; whereby the exposed position of the macromolecule is preferentially observed.

The invention further provides a method for observing an exposed position in a macromolecule that binds a ligand, wherein the macromolecule is larger than 35 kiloDaltons; has a plurality of protons bound to positions on the macromolecule that are exposed to the second molecule; and the exposed protons can exchange with protons of the second molecule. The method includes the steps of (a) performing the method set forth above with a first sample including the macromolecule and a second molecule; (b) performing the method set forth above with a second sample including the macromolecule and the second molecule, wherein the macromolecule is bound to a ligand; and (c) detecting a perturbation in the second sample compared to the first sample; thereby observing the exposed position in the macromolecule that binds the ligand.

A method of the invention for observing an exposed position in a macromolecule that binds a ligand, can alternatively include a first sample containing the macromolecule and a second molecule and a second sample containing the macromolecule, the second molecule and a ligand, wherein the second molecule and ligand alternatively associate with and dissociate from the macromolecule. In another embodiment, the method can include a first sample containing the macromolecule, a second molecule and a first ligand, wherein the second molecule and first ligand alternatively associate with and dissociate from the macromolecule and a second sample containing the macromolecule, the second molecule and a second ligand, wherein the second molecule and second ligand alternatively associate with and dissociate from the macromolecule. The exposed position in the macromolecule that binds the ligand or differentially interacts with the two ligands can be identified or characterized according to a perturbation detected in the second sample compared to the first sample.

BRIEF DESCRIPTION OF THE DRAWINGS

FIGS. 1a to 1e schematically illustrate certain steps in the method of the invention. The following reference numbers are used in these Figures:

1a macromolecule
1 first proton
1c exposed position
3c non-exposed position
3 proton bound to non-exposed position
2a second molecule
2 second proton
4 magnetic field
5 pulse sequence
6 exchange of protons

FIG. 3 shows NMR spectra obtained for a catalytic portion of cytochrome P450 reductase that has been uniformly $^{15}$N/$^{2}$H labeled with protons present selectively at exchangeable positions. A TROSY pulse sequence was used on the left side of the figure. On the right is the corresponding spectra using the SEA-TROSY pulse sequence with a $\tau_m$ of 100 ms.

DETAILED DESCRIPTION OF THE INVENTION

Figure 2A:
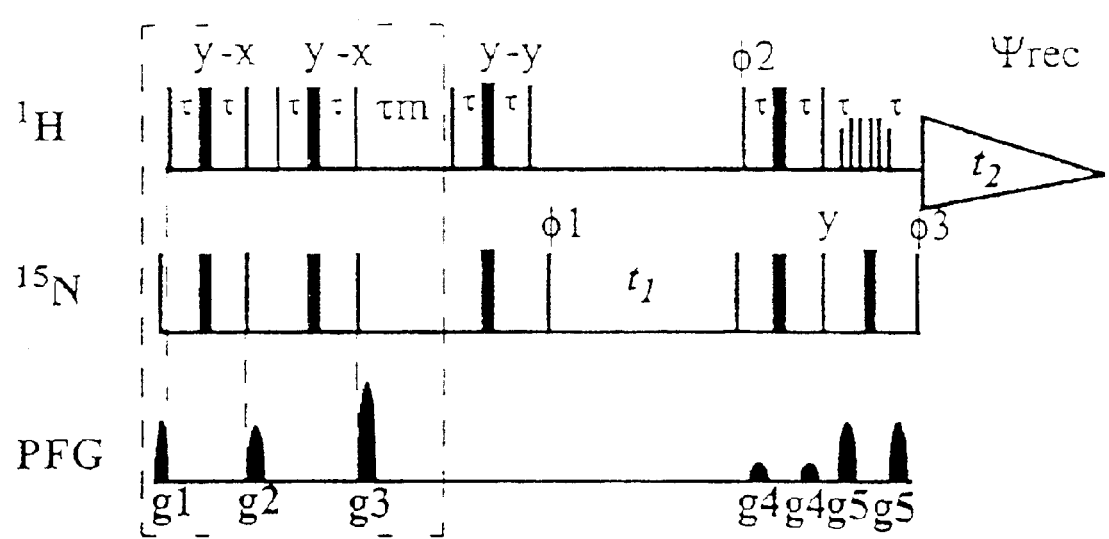
FIG. 2a shows a SEA-TROSY NMR pulse sequence.

The present invention provides methods for preferentially observing certain protons of a macromolecule 1a.

The term "macromolecule" herein means a polymeric molecule or complex of polymeric molecules that are associated in solution, including biological and synthetic polymers. Proteins and other polypeptides are particularly useful biological polymers. Other useful biological polymers include polysaccharides and polynucleotides. Synthetic polymers include plastics and mimics of biological polymers such as protein-nucleic acids.

The methods can be applied to relatively small macromolecules, such as those having molecular weights of 25 kiloDaltons (kDa) or lower, and to larger proteins such as those having molecular weights larger than 30 kDa, 35 kDa, 40 kDa or 50 kDa. The method is particularly useful when applied to very large proteins, including those having molecular weights larger than 75 kDa, 100 kDa, 125 kDa, 150 kDa or 200 kDa. As they are used herein, the term "molecular weight" and the particular molecular weights described are intended to refer to the mass of a macromolecule as it occurs in solution. Where the macromolecule occurs as a complex of more than one molecule, the term refers to the mass of the complex.

The methods of the invention are also useful when the structure of a macromolecule has not been fully determined, such as by X-ray crystallography or by an NMR technique. For example, the method can be applied to macromolecules where resonances for fewer than 5%, 10%, 20%, 30%, 40%, 50% or 75% of the monomer units—such as amino acids, nucleotides or saccharide units—of the macromolecule have been assigned by NMR. Nevertheless, when applied to macromolecular structures that are completely or 80% to 90% to 99% determined, the method can also be useful for characterizing the structure and distinguishing between the functions of individual atoms.

Sources for macromolecules can be natural, recombinant or synthetic. For example, they can be obtained from biological cells or tissues that naturally produce the macromolecule, or from recombinant cells that have been modified to express the macromolecule.

Natural macromolecules can be isolated from various sources by methods known in the art. For example, polynucleotides can be isolated according to methods described in Sambrook et al., *Molecular Cloning: A Laboratory Manual*, 3rd Ed., Cold Spring Harbor Press, Plainview, N.Y. (2001) and Sambrook et al., *Molecular Cloning: A Laboratory Manual*, Cold Spring Harbor Laboratory, N.Y. (1992), and in Ausebel et al., *Current Protocols in Molecular Biology*, John Wiley and Sons, Baltimore, Md. (2000). Methods for isolating polypeptides and proteins from cells and tissues are described in Scopes, *Protein Purification: Principles and Practice*, 3d ed., Springer-Verlag, New York N.Y. (1994); Duetscher, *Methods in Enzymoloqy*, vol. 182, Academic Press, San Diego Calif. (1990); and Coligan et al., *Current Protocols in Protein Science*, John Wiley and Sons, Baltimore Md. (2000). Recombinant expression systems and methods are also described in Goeddel, *Methods in Enzymology*, vol. 185, Academic Press, San Diego Calif. (1990); Wu, *Methods in Enzymology*, vol. 217, Academic Press, San Diego Calif. (1993); Sambrook et al., supra (2001), and Ausebel et al., supra (2000).

Polymeric macromolecules can be produced by well known synthetic methods. A polypeptide or protein can be produced by synthetic methods including Merrifield solid-phase synthesis, t-Boc-based synthesis, Fmoc synthesis and variations on these techniques. Polynucleotides and oligonucleotides can be produced using well known synthetic methods such as those incorporating phosphoramidite chemistry.

Particularly useful macromolecules can be isotopically labeled with $^2$H, $^{13}$C, $^{15}$N or any combination of these isotopes. For example, a protein or polypeptide can be isotopically labeled by adding metabolites such as amino acids to the culture medium of a cell or tissue producing the protein or polypeptide as described in Venters et al., *J. Biomol. NMR* 5:339–344 (1995). Isotope labels can be incorporated into synthetic macromolecules using isotopically labeled reactants under otherwise standard conditions of synthesis.

The term "proton of a macromolecule" or "first proton" 1 used herein means a proton bound to another atom of the macromolecule. The term "bound" used herein refers to when two atoms interact directly, whether ionically, covalently or via hydrogen bonding. The protons can be bound to any atom of the macromolecule, but are typically bound to atoms having electronegative charge or polarity including an oxygen, nitrogen or sulfur. The interaction can be stable or transient so long as it is maintained for sufficient time to detect magnetic coupling between the nuclei. Thus, a proton bound to a macromolecule need not be permanently bound, but can be dissociable. Protons can be dissociable when they exchange with solvent on a timeframe of hours, minutes, seconds, microseconds or microseconds or faster.

The term "second molecule" 2a used herein means any molecule that is not the macromolecule, but has at least one bound proton 2 that is capable of being exchanged. The bound proton of the second molecule is designated as the "second proton" to distinguish it from the first proton, which is bound to the macromolecule.

A useful second molecule is a solvent molecule. The term "solvent" or bulk solvent used herein means molecules that solvate a macromolecule and interact transiently with a surface of the macromolecule. The term "protic solvent" used herein means a solvent that has a proton that is bound to the rest of the solvent molecule or is solvated by a component of the sample other than a macromolecule. A protic solvent can contain a polar X—H bond where X is a heteroatom with a lone pair such as N, O or S. Typically the solvent surrounds the surface of the macromolecule, but can also interact with subregions of the macromolecule, such as when a membrane protein is fully or partially within a lipid bilayer.

It follows that the term "exposed" used herein means a proton or position on the macromolecule that can interact directly with the second molecule. An exposed position of a macromolecule can be one or more atoms on the exterior surface of a macromolecule or within an internal surface such as a channel, cavity or pocket so long as the position can be in direct contact with the second molecule. Furthermore, when a macromolecule can exist as a multimeric complex, individual submits may have positions that are exposed when monomeric, but relatively less exposed or not exposed when complexed. In contrast, a non-exposed atom 3 is restricted from contacting the second molecule, for example due to steric constraints imposed by the macromolecule, shared bonding between two atoms as in a hydrogen bond or location within a hydrophobic region of the macromolecule. Thus, even if the second molecule is not in immediate contact, but can be moved toward and interact with the position on the macromolecule, then the position is exposed; interaction need not be constant or permanent.

Exposed positions on the macromolecule are exposed to bulk solvent. Such solvent-exposed positions can be particularly useful in the methods of the invention because ligands are typically brought into contact with solvent exposed positions of macromolecules. Thus, solvent-exposed positions are likely candidates for binding positions of a macromolecule, where natural ligand or nonnatural ligand mimics can bind. It follows that solvent-exposed positions of a macromolecule can be of particular interest to researchers of ligand-macromolecule interactions.

This invention provides NMR methods for preferentially observing positions of macromolecules that are in such exposed positions. When previous NMR methods were applied to large macromolecules, they detected resonances corresponding to potentially every atom in the macromolecule. The resulting spectra have been overwhelmingly complex so that the sheer number of overlapping resonances have required months, even years to interpret. In many cases, full interpretation is impossible. Ironically, the majority of the atoms are of little interest to researchers trying to understand the interaction between macromolecules and ligands. By focusing on exposed positions, the present invention enables researches to concentrate on likely ligand-binding positions on macromolecules.

As illustrated in FIG. 1a, the method of the invention begins with a sample having a macromolecule 1a and a second molecule 2a. The macromolecule has a proton or "first proton" 1 bound to a position 1c that is exposed to the second molecule. The macromolecule has other protons 3 as well, bound to non-exposed positions 3c. The second molecule has a proton or "second proton" 2 that can exchange with the first proton 1.

In FIG. 1b, a magnetic field 4 is applied to magnetize the protons in the sample, including the first proton 1, the second proton 2, as well as non-exposed protons 3. As illustrated in FIG. 1c, the sample is then irradiated with a pulse sequence 5 that preferentially demagnetizes protons of the macromolecule 1,3 compared to the second proton 2. A duration of time called the mixing time or $\tau_m$, is allowed to pass during which the second proton 2, which has been relatively magnetized, exchanges 6 with the first proton 1, as shown in FIG. 1d.

The term "exchange" when applied herein to first and second protons means the first proton is replaced by a proton of the second molecule. Thus, the first proton dissociates from an exposed position of a macromolecule and associates with a second molecule; likewise, the second proton dissociates from a second molecule and associates with the macromolecule. Thus, the term "exchanged proton" means a proton that was previously associated with one molecule, but is now associated with a different molecule.

As a result of the proton exchange, the second proton 2 becomes bound to the macromolecule at the exposed position 1c. Because the second proton is relatively magnetized and is now bound to the exposed position of the macromolecule 1c, the exposed position can be preferentially observed using NMR methods. By comparison, protons of the macromolecule that are not exposed 3 will be relatively less magnetized due to the demagnetizing pulse sequence, and will be less detectable by the NMR methods. As shown in FIG. 1e, the result is the ability to preferentially observe positions of a macromolecule that are in solvent-exposed positions 1c.

Rather than detect complex resonances of all atoms in a large macromolecule, the resonances arising from atoms outside of the exposed regions can be removed, thereby minimizing overlap of peaks in a spectrum. As a result, the invention provides increased discrimination of resonances from regions of the macromolecule that are of particular interest for understanding ligand binding.

NMR Methods

These NMR methods use the phenomenon of nuclear magnetic resonance, which occurs when a nucleus aligned with an applied magnetic field is induced to absorb energy and change spin orientation with respect to the applied field. The energy at which this orientation change occurs is the resonance energy for the nucleus.

The term "resonance" used herein means a signal arising when an atom in a magnetic field absorbs radiofrequency radiation. Such a signal can be indicated as a peak or other component of a spectrum measured for a macromolecule in an NMR experiment. For a particular atom, the resonance energy is a function of physical properties of the atom and its nucleus, such as the ratio of its magnetic moment to angular momentum or magnetogyric ratio, and the strength of the magnetic field experienced by the nucleus. Thus, an unshielded nucleus in an applied magnetic field will have a resonance energy at the Larmor frequency, which is defined by the strength of the field and its magnetogyric ratio. Generally, atoms in a molecule have their nuclei shielded from the applied magnetic field due to surrounding electrons from other atoms in the molecule. As a result, the shielded nucleus will experience a local magnetic environment that is different from the applied field, and its resonance will be shifted from its Larmor frequency.

NMR spectroscopy can be used to obtain a spectrum of signals arising from individual atoms of a molecule. The shift from the Larmor frequency can generally be used to determine the relative location of individual atoms in a molecule. These relative locations can be used to determine the structure of the molecule. However, large molecules, such as macromolecules, contain many atoms, all having resonances within a small spectral region around the Larmor frequency. Such macromolecules can produce complex spectra with overlapping signals that are difficult to resolve. Therefore, limiting detection to a subset of these atoms can provide advantages for interpreting spectra of large macromolecules.

The term "assigned" used herein in reference to a resonance measured by NMR means the identification of a location for one or more atoms in the sequence or structure of a macromolecule corresponding to this resonance. One or more atom can be located in a structure of a macromolecule relative to a structure for a portion of the macromolecule such as a structure of an amino acid or portion of the structure.

Any atomic nucleus that has either odd mass or odd atomic number, or both, has a magnetic moment and can be detected by NMR methods, including $^1H$, $^{13}C$, $^{15}N$, $^{19}F$ and $^{31}P$. The methods of the invention can be used to preferentially observe any NMR detectable atom that exchanges a demagnetized proton with a magnetized proton from the second molecule, such as a solvent. For biological macromolecules in solvents having pH in the physiological range, an NMR detectable atom that can exchange with a second proton is $^{15}N$. A protein can contain $^{15}N$ atoms with exchangeable protons at a number of locations including at an amino terminus, backbone amide, lysine $\epsilon$-amine, histidine imidizole, arginine guanidinium, tryptophan or asparagine or glutamine amide.

The term "magnetized" used herein means a state of the nucleus where it has a magnetic moment aligned with respect to a magnetic field. The term is intended to include an atomic nucleus in an applied magnetic field having a magnetic moment aligned with or against the direction of the applied magnetic field. A population of atomic nuclei in an applied magnetic field will have members aligned both with and against the direction of the magnetic field.

A magnetic field that magnetizes protons in the methods of the invention can be of any strength sufficient to cause the magnetic dipole of the proton to align with the field. Magnetic field strengths useful in the methods of the invention can be relatively low including 60 to 100 MHz. The methods can also exploit higher resolution available at higher field strengths including at least about 400 MHz, 500 MHz, 600 MHz, 750 MHz, 800 MHz, 900 MHz or higher. Those skilled in the art will know or be able to determine how to produce a polarizing magnetic field using methods known in the art as described, for example, in Fukushima and Roeder, *Experimental Pulse NMR* Adams and Wesley (1981).

A sample used in the methods of the invention can be irradiated with a variety of pulse sequences 5 that preferentially demagnetize a proton bound to an atom of a macromolecule compared to exchangeable second protons.

The term "pulse sequence" used herein means a temporal series of one or more radiofrequency irradiations of defined duration, intensity, frequency and/or relative polarization with respect to a magnetic field and/or one or more magnetic field gradients of defined duration, field strength and relative orientation.

The term "demagnetize" used herein means the process or effect of irradiating the atomic nucleus so that net absorption or emission of energy from a second irradiation is reduced or undetectable. The term is intended to include irradiation of any frequency, duration, intensity or polarization that causes a signal from an atomic nucleus to be reduced or removed from an NMR spectrum. The term includes radio frequency radiation, including oscillating electrical voltages, currents or electromagnetic fields with frequencies in the range of 10 to 1000 MHz or $10^7$ to $10^9$ sec$^{-1}$. The frequency selected depends on the magnetic field strength and the corresponding Larmor frequency for the nucleus of interest at that field strength.

An example of a pulse sequence that can preferentially demagnetize a proton bound to a nitrogen compared to a water proton is the $^{15}$N double filter of the SEA pulse sequence described in Example I and illustrated in FIG. 2. One skilled in the art will recognize that modifications can be made in the $^{15}$N double filter of the SEA pulse sequence as long as the pulse sequence preferentially demagnetizes a proton bound to a nitrogen compared to a water proton. Modifications can include the duration or strength of pulsed field gradients; the intensity, phase, duration or sequence of the pulses; or the duration of the delay τ between pulses. In addition, other pulse sequences that preferentially demagnetize a proton bound to a nitrogen compared to a water proton can be used in the SEA pulse sequence including the $^{15}$N filters described in Breeze, *Prog. NMR Spectr.* 36:323–372 (2000) and Otting and Wuthrich, *Quarterly Rev. Biophys.* 23:39–96 (1990).

Signals arising from a sample irradiated with the demagnetizing pulse sequence are detected at the end of the mixing time. The term "mixing time" or $\tau_m$ is used herein to mean a time period long enough for a dissociable proton bound to a position of a molecule to exchange with a second proton, but insufficient for a dissociable proton bound to a second position of the molecule to exchange with a second proton. For example, the term can refer to a time period long enough for a dissociable proton bound to a position of a macromolecule to exchange with a solvent proton, but insufficient for a dissociable proton bound to a second position of the macromolecule to exchange with a solvent proton. The term can include a time period during which second protons preferentially exchange with an exposed proton of a macromolecule compared to a buried proton of the macromolecule. The term can also include a time period resulting in preferential exchange of a magnetized second proton with an exposed proton bound to an atom of a macromolecule compared to exchange of a magnetized second proton with a buried proton bound to the macromolecule.

The mixing time can be any time period sufficient for a demagnetized proton bound to an exposed position of a molecule to exchange with a magnetized second proton and insufficient for a demagnetized proton, bound to an atom in the interior of the same molecule to exchange with a magnetized second proton. It follows that measurement of signals arising from a macromolecule at $\tau_m$ will preferentially detect exposed positions that have acquired a magnetized proton from the second molecule, while atoms of the macromolecule that are buried in the interior of the macromolecule will not be detected.

A mixing time that provides preferential detection of exposed positions can be in the range of about 25 to 500 msec. The number of signals that can be detected following a demagnetizing pulse sequence of the invention is proportional to the mixing time, so that shorter mixing times will result in fewer atoms of a macromolecule acquiring a magnetized second proton, thereby yielding a smaller number of detected signals. Thus, the invention can be used with shorter mixing times in the range of about 25 msec up to about 50, 100 or 150 msec. A similar relationship exists between the intensity of a detected signal and mixing time, so that increased mixing time will allow more of the macromolecules in a sample to acquire a magnetized second proton at a particular atom, thereby increasing signal for that particular atom. Accordingly, the invention can be used with longer mixing times in the range of about 150 msec up to about 200, 300, 400 or 500 msec.

The methods of the invention can be performed in an iterative fashion to determine a mixing time to achieve sufficient signal detection characteristics, including signal resolution, signal intensity or number of signals in a spectrum. Specifically, the methods can be performed using an initial $\tau_m$ in the range described above and the resulting signal or spectrum can be evaluated for a desired signal detection characteristic. The methods can then be iteratively repeated with systematic changes in $\tau_m$ until a sufficient or desired characteristic is achieved.

Additionally, a mixing time can be determined based on a theoretically estimated proton exchange rate or an empirically measured rate for proton exchange in a macromolecule of interest. An appropriate $\tau_m$ can be determined from a proton exchange rate constant $k_{ex}$ according to the following relationship:

$$I=I_\infty(1-e^{-k_{ex}\cdot \tau_m})$$

where I is the intensity of the signal detected and $I_\infty$ is the intensity at infinite mixing time. NMR-based methods for determining proton exchange rates for atoms with previously assigned resonances are known and described in Gemmecker et al., *J. Am. Chem. Soc.* 115:11620–11621 (1993) and Bai et al., *Prot. Struct. Func. Gen.* 17:75–86 (1993). A proton exchange rate or proton exchange rate constant determined by such methods can be used to determine an appropriate $\tau^m$ for selectively observing a subset of atoms in the macromolecule, such as a subset including those atoms.

Magnetization from an exchanged proton bound to an atom of a macromolecule can be detected using methods known in the art of NMR spectroscopy. Any method for determining dipolar or scalar coupling between a magnetized proton and a bound or proximal atom can be used in the invention. Thus, the methods can be performed in combination with a variety of pulse sequences or heteronuclear filters. One skilled in the art will know or be able to determine an appropriate pulse sequence or filter for use in the methods of the invention including those described in Cavanaugh et al., *Protein NMR Spectroscopy: Principles and Practice*, Academic Press, San Diego Calif. (1996).

A further advantage of the invention is that the methods can be used in combination with a variety of high resolution NMR techniques known in the art to increase the range of macromolecules suitable for structure analysis.

The method of the invention can further incorporate the step of determining a heteronuclear correlation measurement for the sample, where one of the correlated nuclei is $^1H$, such as a $^{15}N$—$^1H$ correlation measurement. Any method for determining a signal or spectrum arising from an $^{15}N$—$^1H$ correlation can be used in the invention including two-dimensional methods such as COSY, NOESY or TROSY techniques. These methods can employ filters to select for particular resonance signals such as an $^{15}N$ filter which can be used in a [$^1H$—$^1H$] NOESY to select for $^{15}N$ attached protons as described in Cavanaugh et al., supra (1996). Pulse sequences for these $^{15}N$—$^1H$ correlation techniques can be used in the methods of the invention as described further below.

COSY refers to Correlation Spectroscopy and includes methods that produce signals arising from coupling between magnetized hydrogen atoms that are covalently connected through one or two other atoms. COSY pulse sequences and methods are known in the art as described in Cavanaugh et al., supra (1996). One skilled in the art will be able to perform the methods of the invention in combination with a COSY pulse sequence by combining the COSY pulse sequence with a pulse sequence of the invention according to the methods exemplified in Example I for combining a SEA pulse sequence with a TROSY pulse sequence. The methods of the invention can be advantageously used in combination with a COSY technique to reduce the number of peaks present in a two-dimensional COSY spectrum of a macromolecule, thereby providing improved resolution and enhanced assignment of structure or function of the macromolecule.

TROSY refers to Transverse Relaxation Optimized Spectroscopy which is a method that reduces line broadening, due to transverse relaxation ($T_2$), in a spectrum of a molecule having two coupled spin ½ nuclei, by using chemical shift anisotropy to cancel out relaxation effects due to cross correlation between dipolar coupling of the two spin ½ nuclei. TROSY provides a $^{15}N$—$^1H$ correlation technique that minimizes signal overlap compared to a standard correlation spectrum.

A combination of TROSY with the methods of the invention can provide particular advantages due to the synergistic effects of combining reduced peak broadening in a spectrum achieved with TROSY and reduction in the number of signals present in a spectrum achieved with the methods of the invention. Specifically, this synergism can simplify a spectrum of a large macromolecule to provide an improved resolution compared to the use of either method in isolation. The TROSY technique and associated pulse sequences are described in U.S. Pat. No. 6,133,736; Wider and Wuthrich, *Current Opinion in Structural Biology* 9:594–601 (1999); and Pervushin et al., *Proc. Natl. Acad. Sci. USA* 94:12366–12371 (1997). One skilled in the art will know that the TROSY pulse sequence can include variants of the pulse sequences described and will be able to recognize a TROSY pulse sequence accordingly.

NOESY or Nuclear Overhauser Effect Spectroscopy refers to a method that can be used to determine, through space, the proximity of atoms in a molecule according to an interaction between proximal nuclei, called the Nuclear Overhauser Effect, that results in transfer of magnetization between the proximal nuclei. A two-dimensional NOESY spectrum contains crosspeaks for protons that are sufficiently proximal to have an NOE interaction. Techniques and pulse sequences for determining NOESY spectra are known in the art, as described in Cavanaugh et al., supra (1996). Since an NOE occurs by spatial proximity, not merely connection via chemical bonds, it is especially useful for determining distances between molecules. The methods of the invention are especially useful for simplifying spectra produced by NOESY techniques and provide the advantage of improving identification of signals arising from proximal nuclei in a macromolecule or between a macromolecule and ligand that would otherwise be difficult or impossible to resolve in the NOESY spectrum alone.

The invention also provides a method for determining an NMR correlation between three nuclei. The method further involves determining a second correlation measurement between the correlated nuclei and a third nucleus.

In one embodiment of the invention, selective observation of a subset of atoms in a molecule can be used with multidimensional NMR techniques.

Multidimensional NMR techniques are known in the art and can be used to measure correlation between a number of different heteronuclei equivalent to the number of dimensions included. For example, a three-dimensional NMR spectrum can be used to determine a heteronuclear NMR correlation between three different heteronuclei such as $^1H$, $^{15}N$ and $^{13}C$.

As with spectra produced from one- and two-dimensional techniques, a three-dimensional spectrum of a macromolecule can be complicated due to the large number of detected signals that can often overlap, resulting in poor resolution of signals. Selective observation of a subset of atoms in a molecule can simplify a three-dimensional spectrum by reducing signal overlap. For example, selective observation of exposed positions in a macromolecule using a 3-D NMR technique can resolve peaks in a three-dimensional spectrum that arise from exposed atoms by removing overlapping signals arising from buried atoms.

The methods of the invention can include determination of correlation between an exchanged magnetized proton, an atom to which it is bound and any third, magnetically active heteronucleus including $^{13}C$. Also included is the selection of either an $^{15}N$ or $^1H$ followed by correlation with two other atoms. A variety of well known triple resonance methods can be used to determine correlation between an exchanged magnetized proton, an atom to which it is bound and $^{13}C$. Such methods include HNCA, HNCACB, CBCA(CO)NH and HNCO. These methods are described in Cavanaugh et al., supra (1996) and share the common feature of having $^1H$ and $^{15}N$ dimensions that can be selected with the SEA element. The third dimension is frequently $^{13}C$, and of different atom types such as alpha carbons ($C_\alpha$ or CA) or carbonyl carbons (CO). Another triple resonance experiment that can be simplified using the methods of the invention is $^{15}N$ edited NOESY.

An example of selective observation of exposed atoms in a macromolecule is provided in Example 2, which describes assignment of NMR signals to specific regions in a large protein structure using spectra obtained with a 3D SEA-HNCA-TROSY pulse sequence. A 3D SEA-HNCA-TROSY spectrum can be particularly useful for determining backbone resonance assignments for exposed loop regions of a protein, as demonstrated in Example II.

The methods of the invention can therefore be used to selectively detect atoms in any macromolecule based on differences in the proton exchange rates. Specifically, the methods can be used to preferentially detect the subset of atoms in positions that have exchanged a proton with a second proton in a defined time period compared to another atom in the molecule that has not exchanged a bound proton.

Therefore, the methods can be used to selectively detect an atom or subset of atoms according to factors such as steric accessability to solvent or another second molecule, thermodynamic stability of the atom-hydrogen bond, pKa or chemical environment of the atom. A subset of atoms of a molecule that can be preferentially detected according to steric accessability to second molecules include positions on the surface of a molecule that can be preferentially detected compared to positions in the interior of the same molecule. A particular subset of atoms includes those that exchange on the 1–1000 msec timescale, relative to others that are more stable such as carbon attached protons. The methods can also be used to detect atoms having more stable proton bonds than other atom-proton bonds, caused by hydrogen bond interactions with a second atom or differences in local polarity, hydrophobicity or hydrophilicity. In particular, the amide nitrogens present in a protein can have different stabilities due to their occurrence in a variety of local protein environments and ability to participate in hydrogen bond interactions in alpha-helices or beta-sheet structures. Thus, preferential observation of amide signals by the methods of the invention can be useful for structural and functional characterization of proteins.

The invention also provides detection according to extrinsic factors influencing the atoms of the molecule. Specifically, different atoms or subsets of atoms can be preferentially detected by performing the methods of the invention under different conditions such as pH, temperature, polarity or presence of a ligand.

The methods can be used in combination with changes in extrinsic factors to select a different atom or subset of atoms that is preferentially detected. For example, by changing the pH of a sample, different subsets of atoms can be detected according to the differences in pKa for atoms in the molecule. The resulting combination of spectra can provide a larger number of resolved signals when compared to a single spectrum, thereby increasing the number of resolved signals that can be used for structure determination of the molecule. Additionally, comparison of signals or subsets of signals that result under different conditions can be used to determine dynamics or function of the molecule.

Ligand Methods

Figures 5A, 5B:
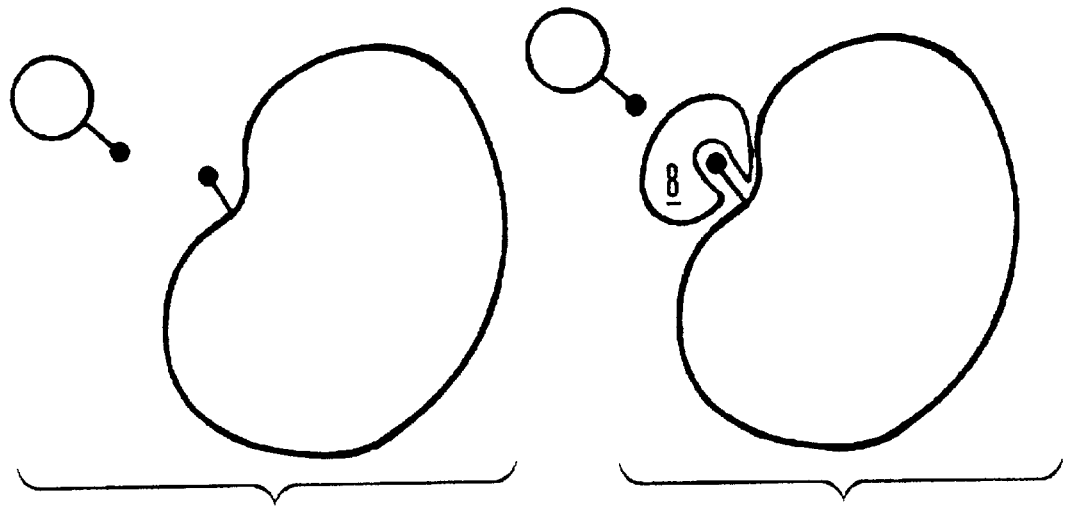
FIGS. 5a to 5d show various embodiments of the method of the invention.
Figure 5C:
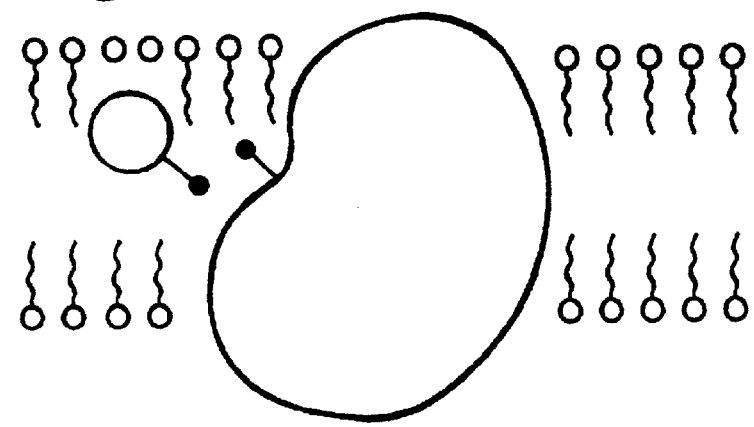
Figure 5D:
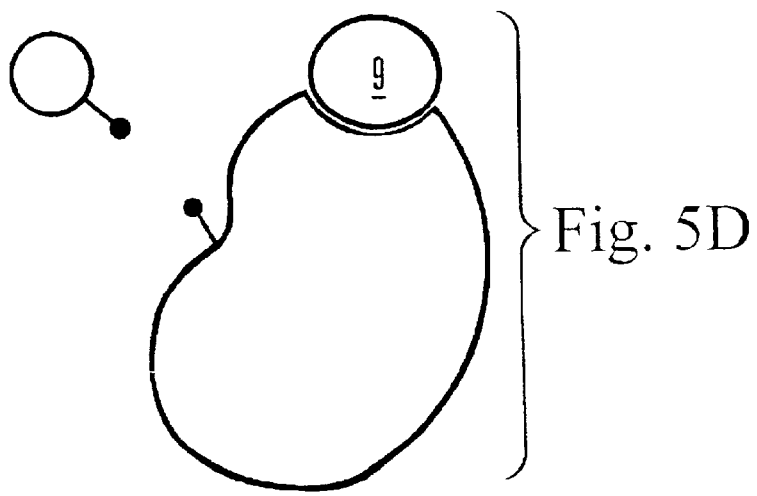

The use of ligands expands the possible applications for the method of the invention. For example, the second molecule can be a ligand, such as a ligand in a bulk solvent (FIGS. 5a and 5c) or present in a lipid bilayer (FIG. 5c). The macromolecule in the sample can also be bound to a ligand 9, whether at an exposed position (FIG. 5d) or a non-exposed position.

The invention further provides a method for identifying an exposed position in a macromolecule that binds a ligand, where the macromolecule has a plurality of protons bound to positions on the macromolecule that are exposed to the second molecule, and the exposed protons can exchange with protons of the second molecule. The method involves the steps of performing the method described above with samples of macromolecule bound (FIG. 5b) and not bound (FIG. 5a) to a ligand 8. Then chemical shift perturbations are detected in the bound sample compared to the unbound sample. In addition to chemical shift perturbation, other changes that can be measured include reduced signal intensity or differential proton exchange between the samples. As a result, the method identifies the exposed position in a macromolecule that binds the ligand.

The ligand binding sites of macromolecules generally contain atoms that are bound to rapidly exchanging protons and are often located in exposed regions, whereas atoms buried in the interior of a macromolecule or involved in hydrogen bonding are unlikely to interact with a ligand. For example, loop regions of proteins are often primary components of protein binding site regions. A majority of atoms located in protein loop regions are typically not involved in hydrogen bonds or secondary structure interactions and are thus prone to rapid exchange with second protons. Therefore, selective observation of exposed atoms in a protein using the methods of the invention can provide selective observation of those atoms that interact with a ligand.

The methods of the invention can be used to observe an exposed position in a macromolecule that binds a ligand where the macromolecule has a plurality of protons bound to positions on the macromolecule that are exposed to the second molecule, and the exposed protons can exchange with protons of the second molecule. The method involves the steps of performing the method described above with samples of macromolecule in the presence and absence of a ligand, wherein the second molecule and ligand alternatively associate with and dissociate from the macromolecule. The exposed position can be identified or characterized according to a perturbation in the presence of the ligand compared to in the absence of the ligand. Similarly, the method can involve the steps of performing the method with a first sample of a macromolecule in the presence of a first ligand and a second sample of a macromolecule in the presence of a second ligand, wherein each of the ligands can associate with and dissociate from the macromolecule alternatively with the second molecule. The exposed position can be identified or characterized according to a perturbation in the presence of the first ligand compared to in the presence of the second ligand.

As used herein, the term "perturbation" refers to the act of changing or state of being changed. The term can include an NMR perturbation which is the act of magnetizing or demagnetizing an atomic nucleus or the resulting magnetization state of a nucleus. The term can also include a sample perturbation, which is the act of changing one sample compared to another or the state of one such sample compared to the other, in separate, but substantially similar experiments. Resulting changes occurring in such samples can be observed as detected perturbations and include significant difference in an NMR measurement or spectrum for one of the samples compared to the other.

The invention provides advantages for determination of macromolecule-ligand interactions in that the methods can produce a spectrum where signals arising from slower exchanging atoms, which tend not to interact with a ligand, can be removed to minimize potential overlap with signals arising from atoms located in a ligand binding site. Thus, the methods allow high resolution characterization of protein-ligand interactions for larger macromolecules than would be possible without selective observation of binding site atoms.

The invention can be used with any ligand that interacts with a macromolecule with sufficient stability to be observed in the time frame of an NMR experiment, including chemical or biological molecules such as simple or complex organic molecules, metal-containing compounds, carbohydrates, peptides, peptidomimetics, carbohydrates, lipids and nucleic acids. Thus, an interaction between proteins or subunits of a protein can be considered as a macromolecule-ligand binding interaction where one of the proteins or subunits is considered a ligand for the other protein or subunit. The methods can be used to observe interactions of ligands having affinities for a macromolecule in a variety of ranges observable by NMR methods. The composition of the sample can be manipulated to alter the rates of association or dissociation of a ligand with a macromolecule. Factors that can be manipulated include the type of ligand used, pH of the sample, concentration of the ligand or macromolecule or temperature. Using such manipulations those skilled in the art can provide conditions where the rate at which the ligand associates with the macromolecule is slower than or comparable to the rate at which the exposed protons of the macromolecule exchange with protons of the second molecule. Thus, conditions can be provided where the rate at which the ligand associates with the macromolecule is at most 10, 100 or 1000 fold higher than the rate at which the exposed protons of the macromolecule exchange with protons of the second molecule. As set forth above, the time allowed for proton exchange to occur can also be adjusted to suit a particular ligand and its dissociation and association rates.

The term "ligand" used herein means a molecule that can specifically bind to a macromolecule. "Specific binding" means that the binding is detectable over non-specific interactions by quantifiable assays well known in the art. A ligand can be essentially any type of natural or synthetic molecule including a protein, polypeptide, nucleic acid, carbohydrate, lipid, amino acid, nucleotide or any organic-derived compound. The term also encompasses a cofactor or a substrate of a polypeptide having enzymatic activity or substrate that is inert to catalytic conversion by the bound polypeptide.

In one embodiment, the methods of the invention can be used with a ligand that is a nucleotide derivative, including a nicotinamide adenine dinucleotide-related molecule. Nicotinamide adenine dinucleotide-related (NAD-related) molecules that can be used in the methods of the invention include oxidized nicotinamide adenine dinucleotide (NAD$^+$), reduced nicotinamide adenine dinucleotide (NADH), oxidized nicotinamide adenine dinucleotide phosphate (NADP$^+$) and reduced nicotinamide adenine dinucleotide phosphate (NADPH).

Although ligands that naturally bind to the macromolecule can be used, ligand mimics can also be used in place of a natural ligand. A mimic is a molecule that has at least one function that is substantially the same as a function of a second molecule. A mimic of a ligand can be identified according to its ability to bind to the same sites on a macromolecule as the ligand. For example, a mimic can be identified by a binding competition assay using a ligand and a mimic. The structure of a mimic can be similar or different compared to the structure of the ligand it mimics as long as the two molecules bind to the same binding site region on a macromolecule. The term can encompass molecules having portions similar to corresponding portions of the ligand in terms of structure or function.

Examples of mimics to the ligand NADH, including Cibacron Blue, are described in *Dye-Ligand Chromatography*, Amicon Corp., Lexington Mass. (1980). Numerous other examples of NADH-mimics, including useful modifications to obtain such mimics, are described in Everse et al., *The Pyridine Nucleotide Coenzymes*, Academic Press, New York N.Y. (1982). Particular analogs include nicotinamide 2-aminopurine dinucleotide, nicotinamide 8-azidoadenine dinucleotide, nicotinamide 1-deazapurine dinucleotide, 3-aminopyridine adenine dinucleotide, 3-acetyl pyridine adenine dinucleotide, thiazole amide adenine dinucleotide, 3-diazoacetylpyridine adenine dinucleotide and 5-aminonicotinamide adenine dinucleotide. Particular mimics can be identified and selected by ligand-displacement assays, for example using competitive binding assays with a known ligand. Mimic candidates can also be identified by searching databases of compounds for structural similarity with the ligand or a mimic.

In another embodiment, the methods of the invention can be used with a ligand that is an adenosine phosphate-related molecule. Adenosine phosphate-related molecules can be selected from the group consisting of adenosine triphosphate (ATP), adenosine diphosphate (ADP), adenosine monophosphate (AMP) and cyclic adenosine monophosphate (cAMP). An adenosine phosphate-related molecule can also be a mimic of these molecules. Mimics of an adenosine phosphate-related molecule include quercetin, adenylylimidodiphosphate (AMP-PNP) or olomoucine.

A ligand useful in the methods of the invention can be a cofactor, coenzyme or vitamin including NAD, NADP or ATP as described above. Other examples include thiamine (vitamin B$_1$), riboflavin (vitamin B$_2$), pyridoximine (vitamin B$_6$), cobalamin (vitamin B$_{12}$), pyrophosphate, flavin adenine dinucleotide (FAD), flavin mononucleotide (FMN), pyridoxal phosphate, coenzyme A, ascorbate (vitamin C), niacin, biotin, heme, porphyrin, folate, tetrahydrofolate, nucleotide such as guanosine triphosphate, cytidine triphosphate, thymidine triphosphate, uridine triphosphate, retinol (vitamin A), calciferol (vitamin D$_2$), ubiquinone, ubiquitin, a-tocopherol (vitamin E), farnesyl, geranylgeranyl, pterin, pteridine and S-adenosyl methionine (SAM).

A protein or polypeptide can be used as a ligand in the invention. Examples of protein and polypeptide ligands include naturally occurring polypeptide ligands such as ubiquitin or polypeptide hormones including insulin, human growth hormone, thyrotropin releasing hormone, adrenocorticotropic hormone, parathyroid hormone, follicle stimulating hormone, thyroid stimulating hormone, luteinizing hormone, human chorionic gonadotropin, epidermal growth factor and nerve growth factor. In addition a ligand useful in the methods of the invention can be a non-naturally occurring protein or polypeptide that has binding activity. Such ligands can be identified by screening a synthetic polypeptide library, such as a phage display library or combinatorial polypeptide library as described below. A protein or polypeptide ligand can also contain amino acid analogs or derivatives such as those described below. Methods of isolation of protein or polypeptide ligands are well known in the art and are described in Scopes, supra; Duetscher, supra; and Coligan et al., *Current Protocols in Protein Science*, John Wiley and Sons, Baltimore, Md. (2000).

A nucleic acid can also be used as a ligand in the invention. Examples of nucleic acid ligands useful in the invention include DNA, such as genomic DNA or cDNA or RNA such as mRNA, ribosomal RNA or tRNA. A nucleic acid ligand can also be a synthetic oligonucleotide. Such ligands can be identified by screening a random oligonucleotide library for ligand binding activity as described below. Nucleic acid ligands can also be isolated from a natural source or produced in a recombinant system using well known methods in the art including those described in Sambrook et al., supra; Ausubel et al., supra.

A ligand used in the invention can be an amino acid, amino acid analog or derivatized amino acid. An amino acid ligand can be one of the 20 essential amino acids or any other amino acid isolated from a natural source. Amino acid analogs useful in the invention include neurotransmitters such as γ-amino butyric acid, serotonin, dopamine, or norepinephrine or hormones such as thyroxine, epinephrine or melatonin. A synthetic amino acid or analog can also be used in the invention. A synthetic amino acid can include chemical modifications of an amino acid such as alkylation, acylation, carbamylation, iodination or any modification that derivatizes the amino acid. Such derivatized molecules include those molecules in which free amino groups have been derivatized to form amine hydrochlorides, p-toluene sulfonyl groups, carbobenzoxyl groups, t-butyloxycarbonyl groups, chloroacetyl groups or formyl groups. Free carboxyl groups can be derivatized to form salts, methyl and ethyl esters or other types of esters or hydrazides. Free hydroxyl groups can be derivatized to form O-acyl or O-alkyl derivatives. The imidazole nitrogen of histidine can be derivatized to form N-benzylhistidine. Naturally occurring amino acid derivatives of the twenty standard amino acids can also be included in a cluster of bound conformations including 4-hydroxyproline, 5-hydroxylysine, 3-methylhistidine, homoserine, ornithine and carboxylglutamate.

A lipid ligand can also be used in the invention. Examples of lipid ligands include triglycerides, phospholipids, glycolipids or steroids. Steroids useful in the invention include glucocorticoids, mineralocorticoids, androgens, estrogens and progestins.

Another type of ligand that can be used in the invention is a carbohydrate. A carbohydrate ligand can be a monosaccharide such as glucose, fructose, ribose, glyceraldehyde and erythrose; a disaccharide such as lactose, sucrose or maltose; oligosaccharide such as those recognized by lectins such as agglutinin, peanut lectin or phytohemagglutinin, or a polysaccharide such as cellulose, chitin or glycogen.

An atom in a macromolecule that binds a ligand can be identified with the methods of the invention according to differential exchange of protons at the atom in the presence and absence of the ligand. Specifically, an atom in a macromolecule can be identified as interacting with the ligand when it is protected from acquiring a magnetized proton from the second molecule when the ligand is present to a greater extent than when the ligand is absent. For example, SEA-TROSY NMR spectra acquired for a macromolecule in the presence and absence of a ligand can be compared. NMR cross peaks that change intensity or chemical shift between the two spectra can be identified as corresponding to atoms that interact with the ligand. The improved signal resolution and spectral simplification resulting from selective observation of the subset of atoms involved in ligand binding can provide improved detection of changes in intensity or chemical shift for large macromolecules due to removal of potentially overlapping signals arising from atoms not involved in ligand binding.

The methods can also be used to determine the structure and dynamics of a ligand binding site. Three-dimensional NMR techniques such as those described above can be used in combination with selective observation of subsets of atoms in a macromolecule to assign structure to a binding site region or loop. For example, SEA-HNCA-TROSY or SEA-HNCACB-TROSY spectra can be obtained for a macromolecule in the presence and absence of a ligand to identify atoms of the macromolecule that interact with the ligand and to assign their structure. These experiments are particularly attractive because $^{13}C^\alpha$ and $^{13}C^\beta$ chemical shifts are characteristic of certain amino acid types, as described in Cavanaugh et al., *Protein NMR Spectroscopy: Principles and Practice*, Academic Press, San Diego Calif. (1996), and can facilitate the assignment process. This can provide complete backbone and $^{13}C^\beta$ resonance assignments for most of loop regions of the molecule and therefore of the binding site region. In addition to providing structure determination for ligand binding site regions, the methods can be used to determine dynamics of a binding site. For example, $^{15}N$ spin relaxation measurements can be used to obtain information on internal dynamics of binding site loops as described in Cavanaugh et al., supra. Combination of SEA-TROSY with $^{15}N$ spin relaxation measurements can provide such determinations with larger macromolecules than available with $^{15}N$ spin relaxation measurements using TROSY only.

The methods can also be used to identify differences in the interactions that mediate binding of different ligands at the same binding site region or loop of a macromolecule. These differences can be identified using methods similar to those described above for comparing a macromolecule in the presence and absence of a ligand except that the methods are carried out with a macromolecule in the presence of a first and second ligand and the respective spectra compared. Atoms that are differentially protected from second molecule exchange by the two ligands can be identified as having a stronger interaction with the first ligand than the second ligand. For example, an atom that has a stronger signal due to acquisition of a magnetized proton in the presence of a first ligand when compared to a signal measured in the presence of a second ligand, can be identified as being protected from a second molecule to a greater extent by the second ligand. Thus the atom can be identified as having a stronger interaction with the second ligand than the first ligand. In cases where presence of the ligand does not cause the binding site resonances to disappear entirely, chemical shift perturbation can be detected. More specifically, crosspeaks perturbed in chemical shift in the first spectrum compared to the second spectrum can be used to identify binding site residues or structural and functional characteristics of binding site residues.

The following examples are intended to illustrate but not limit the invention.

EXAMPLE I

Detection of Solvent-exposed Amides Using SEA-TROSY

This example demonstrates the simplification of an NMR spectrum of a large protein by selective observation of solvent-exposed $^{15}N$ atoms on the protein. A SEA-TROSY (Solvent-Exposed Amides with TROSY) spectrum was determined with a uniformly $^{15}N/^2H$-labeled catalytic portion of the enzyme cytochrome P450 reductase from rat liver (P450R). As a reference, an $^{15}N,^1H$ TROSY spectrum was also determined for P450R.

P450R consists of residues 56–678 of the rat protein and has a molecular weight of 71 kDa. The $^{15}N/^2H$ labeled P450R protein was expressed in *E. coli* grown in $D_2O$ on $^{15}N$-Amonium Chloride containing Celltone (Martek Biosciences Corp., Columbia Md.) supplemented M9 minimal media in a bioflo fermentor (New Brunswick Scientific, Edison N.J.). The $^{15}N/^2H$ labeled P450R protein was isolated from the soluble fraction of the *E. coli* cells using anion exchange and 2',5'-ADP-affinity chromatography as described in Shen et al., *J. Biol. Chem.* 264:7584–7589 (1989). The $^{15}$N/$^2$H labeled P450R protein was stored in H$_2$O such that the amides and hydroxyls exchanged and became protonated leaving all other non-exchanged positions deuterated. A sample containing 200 µl of a 0.5 mM concentration of the $^{15}$N/$^2$H labeled P450R at pH 7.5 was used for NMR spectroscopy measurements as described below.

The SEA-TROSY spectrum was obtained with the pulse sequence shown in FIG. 2a with a $\tau_m$ of 100 ms. The TROSY spectrum was obtained with the pulse sequence shown in FIG. 2a without the SEA element shown in the dashed box. For the pulse sequences shown in FIG. 2, narrow and wide bars represent 90 and 180 degree radiofrequency (rf) pulses, respectively. Unless specified otherwise, pulse phases are along the x-axis. The pulsed field gradients were 500 µs in duration with strengths of $g_1$=20 G/cm, $g_2$=30 G/cm, $g_3$=40 G/cm, $g_4$=15 G/cm and $g_5$=55 G/cm. The delay $\tau$ was set to 2.7 ms. The phase cycle was $\phi_1$=y, -y, -x, x; $\phi_2$=y; $\phi_3$=x; $\psi_{rec}$=x, -x, -y, y. A phase sensitive spectrum in the $^{15}$N dimension was obtained by recording a second FID for each t2 value, with $\phi_1$=-y, y, -x, x, $\phi_2$=-y and $\phi_3$=-x, and the data processed as described in Pervushin et al., *J. Biomol. NMR* 12:345–348 (1998). Residual water suppression was obtained with a WATERGATE sequence implemented with a 3-9-19 composite pulse as described in Sklenar et al., *J. Magn. Reson.* 102:241–244 (1993). The part of the sequence occurring before $\tau_m$ in the pulse sequence shown in FIG. 2a is the $^{15}$N double filter.

The spectra were recorded at 303° K. on a Bruker DRX700 (Bruker AG, Fällanden, Switzerland) operating at 700 MHz $^1$H frequency, equipped with four rf channels, a triple resonance probe with a shielded triple axis gradient coil and deuterium switch box for deuterium decoupling. For each spectrum, 128 (t1)*1024(t2) complex points were recorded. Spectra were acquired and processed with XWIN-NMR (Bruker AG). Spectra were analyzed using XEASY as described in Bartels et al., *J. Biomol. NMR* 5:1–10 (1995).

As shown in the TROSY panel on the left side of FIG. 3, only about 400 out of 630 expected crosspeaks could be resolved in the spectrum. Most of the spectrum was characterized by severe resonance overlap, precluding resonance assignments.

In contrast, the spectrum from the SEA-TROSY experiment at 100 ms mixing time, shown in the right panel of FIG. 3 is dramatically simplified with significantly reduced resonance overlap. The level of spectral complexity and amount of resonance overlap observed in the spectrum was found to change with mixing time $\tau_m$, so that increased mixing time led to increased complexity and resonance overlap.

EXAMPLE II
Combination of the SEA Element with Other NMR Pulse Sequences

Figure 4A:
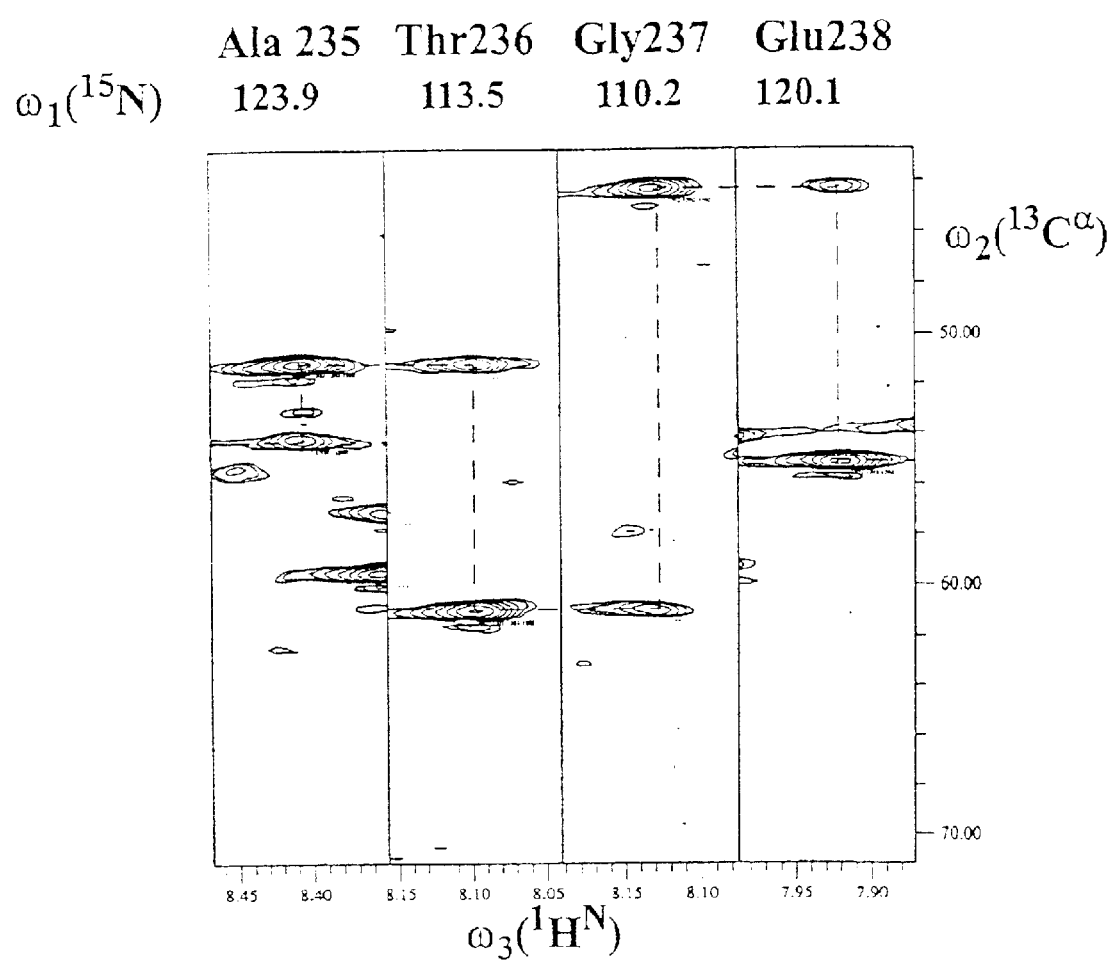
FIGS. 4a to 4c show representative $\omega_1$ ($^{13}$C$^\alpha$)—$\omega_3$ ($^{1}$H$^N$) strips from a 3D SEA-HNCA-TROSY spectrum for a 0.5 mM sample of a $^{15}$N/$^{2}$H/$^{13}$C labeled catalytic portion of cytochrome P450 reductase. The assignments for the loop of residues Ala 235 to Glu 238 (FIG. 4a), Ala 500 to Asn 503 (FIG. 4b), and Asp 632 to Ala 633 (FIG. 4c) are shown with sequential $^{13}$C$^\alpha$(i)/$^{13}$C$^\alpha$(i−1) connectivities indicated by the dashed line.
Figure 4B:
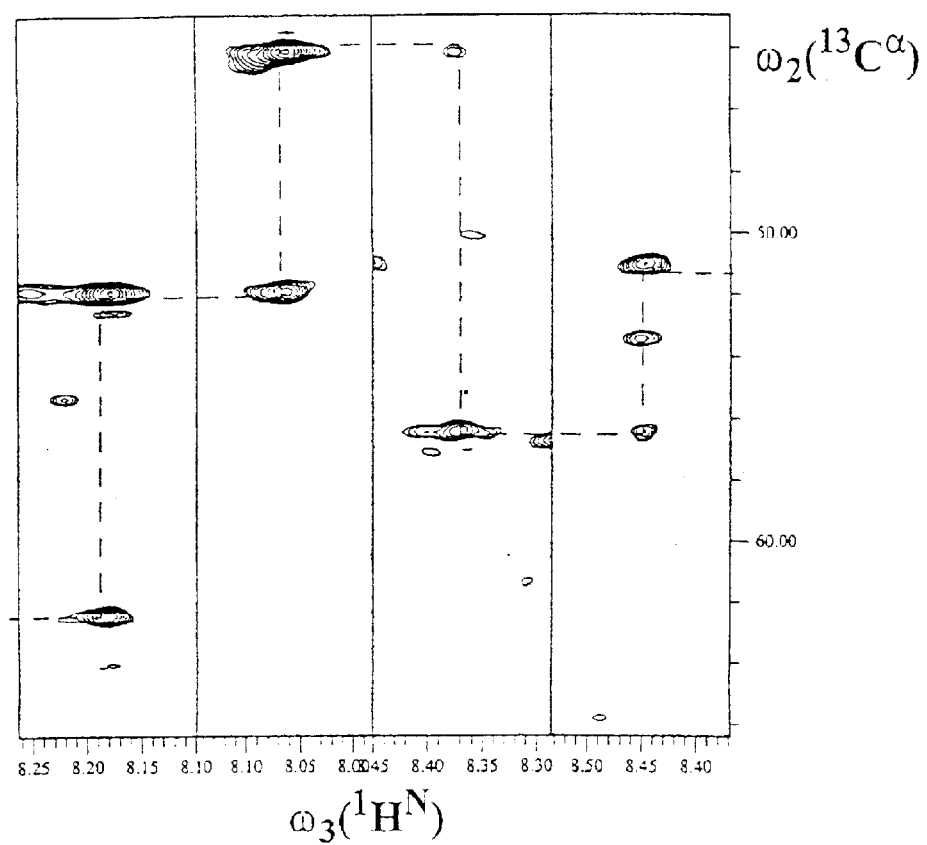
Figure 4C:
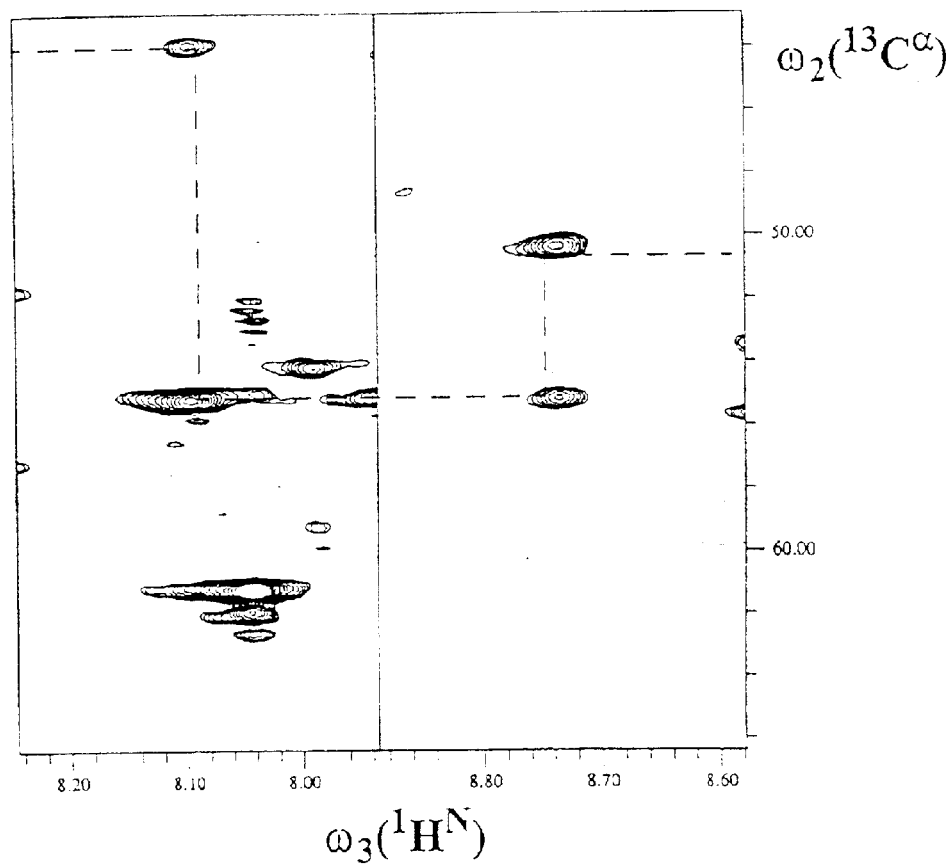

This example demonstrates assignment of NMR signals to specific regions in a large protein structure using spectra obtained with a combination of the SEA pulse sequence and other NMR pulse sequences. A 3D SEA-HNCA-TROSY spectrum was acquired for $^{15}$N/$^{13}$C/$^2$H labeled P450R and is shown in FIGS. 4a to 4c. A 3D HNCA-TROSY spectrum can be used to determine connectivities between $^{13}$C$^\alpha$ atoms in a protein backbone as described in Salzmann et al., *Proc. Natl. Acad. Sci. USA* 95:13585–13590 (1998).

The $^{15}$N/$^{13}$C/$^2$H P450R was expressed and isolated as described in Example I except that $^{13}$C was added to the growth medium in the form of (U—$^{13}$C)glucose. A sample containing 200 µl of a 0.5 mM concentration of the $^{15}$N/$^{13}$C/$^2$H labeled P450R at pH 7.5 was used for NMR spectroscopy measurements as described below.

Figure 2B:
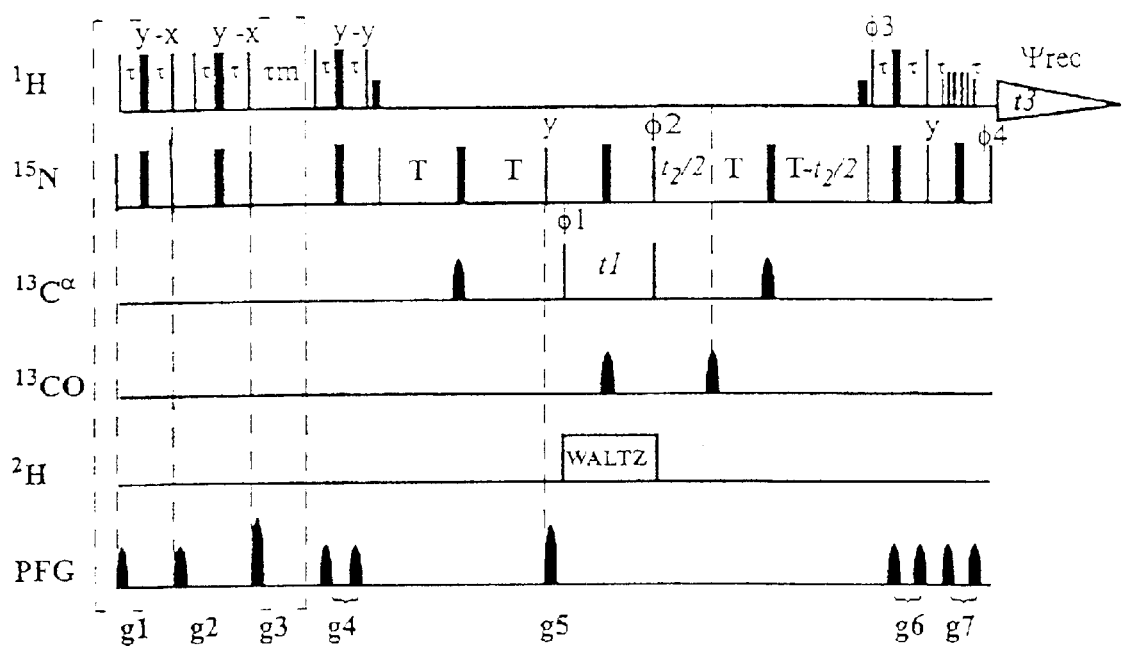
FIG. 2b shows a SEA-HNCA-TROSY pulse sequence. The SEA element is enclosed by a dashed rectangle in both figures.

The spectra were acquired, processed and analyzed as described in Example I using the pulse sequence shown in FIG. 2b. The SEA element was combined with a 3D HNCA-TROSY pulse scheme (Saltzman et al., supra (1998)) to produce the 3D SEA-HNCA-TROSY pulse scheme shown in FIG. 2b. $^{13}$C$^\alpha$ 180 degree pulses are band-selective REBURP pulses as described in Geen and Freeman, *J. Maan. Reson.* 93:93–96 (1991). The REBURP pulses have 250 µs duration centered at 53 ppm and are designed to selectively excite the $^{13}$C$^\alpha$ region without exciting the $^{13}$CO region (~177 ppm). This was done to avoid losses of magnetization due to $^{15}$N—$^{13}$CO $^1$J coupling constants (~15 Hz). $^{13}$CO decoupling pulses were off-resonance, Gaussian shaped pulses of 120 µs duration shifted to 177 ppm. The delays were $\tau$=2.7 ms; T=11 ms. The phase cycle was $\phi_1$=4(x), 4(-x); $\phi_{2=}$y, -y, -x, x; $\phi_3$=y; $\phi_4$=x; $\psi_{rec}$=x, -x, -y, y, -x, x, y, -y. A phase-sensitive spectrum in the $^{15}$N dimension was obtained by recording a second FID for each t2 value, with $\phi_2$=2(x), 2(-x); $\phi_3$=x, -x, and the data processed as described in Pervushin et al., supra. States-TPPI quadrature detection in the $^{13}$C$^\alpha$ dimension was achieved by incrementing $\phi_1$ as described in Marion et al., *J. Magn. Reson.* 85:393–399 (1989). The pulsed field gradients were 500 µs in duration with strengths of $g_1$=20 G/cm, $g_2$=30 G/cm, $g_3$=40 G/cm, $g_4$=15 G/cm, $g_5$=40 G/cm, $g_6$=15 G/cm, $g_7$=55 G/cm. $^2$H decoupling during $^{13}$C$^\alpha$ evolution was achieved with a WALTZ-16 composite pulse, as described in Shaka et al., *J. Magn. Reson.* 52:335–338 (1983), at a field strength of 2.5 kHz. Suppression of residual water was achieved with a WATERGATE sequence using a 3-9-19 composite pulse as described in Sklenar et al., supra.

Combination of the SEA element with the 3D HNCA-TROSY element provided a 3D SEA-HNCA-TROSY which was simplified compared to the same spectrum acquired without the SEA element. As shown in FIGS. 4a to 4c, the simplified spectrum could be used to assign resonances in several loop regions of P450R. A stretch of a loop consisting of residues Ala 235 to Glu 238 could be obtained via the sequential $^{13}$C$^\alpha$(i)/$^{13}$C$^\alpha$(i-1) connectivities indicated by the dashed line in FIG. 4a and the unique chemical shift pattern of this stretch of residues versus the primary structure of P450R. Using a similar approach loops consisting of Ala 500 to Asn 503 and Asp 632 to Ala 633 were sequentially assigned as shown in FIGS. 4b and 4c.

Because solvent-exposed residues are often located in loops, these can be easily assigned via $^{13}$C$^\alpha$ connectivities, as in Cavanaugh et al., supra. Several solvent-exposed loop regions in P450R were implicated in its function. Assignments of chemical shifts for these loops using the above described methods can be used to characterize their involvement in protein catalysis, protein-protein interactions and allosteric modulation, that determine the complex function of this ubiquitous protein including functions described in Wang et al., *Biochemistry* 94:8411–8416 (1997). For example, the small loop of residues Gly 631 to Ala 633 is of particular interest because it is adjacent to the catalytic residue Cys 630 and presumably makes contact with the third cofactor NADP as described in Wang et al., supra, and Shen et al., *J. Biol. Chem.* 274:5391–5398 (1999).

The publications cited herein are hereby incorporated by reference. The term "comprising" is intended herein to be open-ended, including not only the recited elements, but further encompassing any additional elements.

Although the invention has been described with reference to the examples provided above, it should be understood that various modifications can be made without departing from the spirit of the invention. Accordingly, the invention is limited only by the claims.

We claim:

1. A method for identifying an exposed position of a macromolecule, comprising the steps of
   (a) obtaining a sample comprising a macromolecule and a second molecule, wherein
   the macromolecule is larger than 35 kiloDaltons and has a position that is exposed to the second molecule,
   wherein a first proton is bound to the exposed position of the macromolecule, a second proton is bound to the second molecule, and the first proton exchanges with the second proton;
   (b) applying a magnetic field to the sample, thereby magnetizing the first proton and the second proton;
   (c) irradiating the sample with a sea-trosy pulse sequence that preferentially demagnetizes the protons of the macromolecule relative to the second proton;
   (d) allowing the second proton to exchange with the first proton, whereby the relatively magnetized second proton becomes bound to the exposed position of the macromolecule; and
   (e) detecting the magnetization from the second proton;
   whereby the exposed position of the macromolecule is identified.

2. The method of claim 1, wherein the macromolecule is a polypeptide.

3. The method of claim 1, wherein the macromolecule is larger than about 50 kDa.

4. The method of claim 1, wherein the macromolecule is larger than about 75 kDa.

5. The method of claim 1, wherein the macromolecule is larger than about 100 kDa.

6. The method of claim 2, wherein the structure of the polypeptide has not been fully determined by an NMR technique.

7. The method of claim 2, wherein resonances for fewer than 5% of the amino acids of the polypeptide have been assigned by NMR techniques.

8. The method of claim 2, wherein resonances for fewer than 10% of the amino acids of the polypeptide have been assigned by NMR techniques.

9. The method of claim 2, wherein resonances for fewer than 50% of the amino acids of the polypeptide have been assigned by NMR techniques.

10. The method of claim 2, wherein resonances for fewer than 75% of the amino acids of the polypeptide have been assigned by NMR techniques.

11. The method of claim 1, wherein the second molecule is a protic solvent.

12. The method of claim 1, wherein the second molecule is water.

13. The method of claim 1, wherein the position on the macromolecule that is exposed to the second molecule comprises $^{15}N$.

14. The method of claim 13, wherein the pulse sequence comprises an $^{15}N$ filter.

15. The method of claim 1, wherein step (c) further comprises $^{15}N$, $^1H$ TROSY.

16. The method of claim 1, wherein step (d) occurs during a predetermined mixing time.

17. The method of claim 16, wherein the mixing time is between 25 and 300 ms.

18. The method of claim 16, wherein the mixing time is between 50 and 150 ms.

19. The method of claim 16, wherein the mixing time is between 80 and 120 ms.

20. The method of claim 1, further comprising the step of
   (f) determining a heteronuclear correlation measurement for the sample, wherein one of the correlated nuclei is $^1H$.

21. The method of claim 20, wherein the correlation measurement is an $^{15}N$—$^1H$ correlation measurement.

22. The method of claim 20, further comprising the step of
   (g) determining a second heteronuclear correlation measurement between the correlated nuclei and a third nucleus.

23. The method of claim 22, wherein step (g) includes a HNCA measurement.

24. The method of claim 22, wherein step (g) includes a HNCACB measurement.

25. The method of claim 1, further including a NOESY measurement.

26. The method of claim 1, wherein the macromolecule has a ligand bound to a position other than the exposed position.

27. The method of claim 1, wherein the second molecule is a ligand.

28. The method of claim 27, wherein the ligand is a natural ligand of the macromolecule.

29. The method of claim 27, wherein the ligand is a mimic of a natural ligand of the macromolecule.

30. The method of claim 27, wherein the sample is in a solvent, further comprising the step of irradiating the sample with a pulse sequence that preferentially demagnetizes the protons of the solvent.

31. A method for identifying an expose position in a macromolecule that binds a ligand,
   wherein the macromolecule is larger than 35 kiloDaltons; has a plurality of protons bound to positions on the macromolecule that are exposed to the second molecule; and the exposed protons can exchange with protons of the second molecule; comprising the steps of
   (a) performing the method of claim 1 to a first sample comprising the macromolecule and a second molecule;
   (b) performing the method of claim 1 to a second sample comprising the macromolecule, the second molecule and a ligand, wherein the macromolecule is bound to the ligand; and
   (c) detecting a perturbation in the second sample compared to the first sample;
   thereby indentifying the exposed position in the macromolecule that binds the ligand.

32. The method of claim 31, wherein the perturbation is a chemical shift change.

33. The method of claim 31, wherein the perturbation is reduced signal intensity.

34. The method of claim 31, wherein the perturbation is differential proton exchange between the first and second sample.

35. The method of claim 31, wherein a second ligand is bound to the macromolecule in the first sample in a position other than the binding position of the first ligand.

36. A method for indentifying an exposed position in a macromolecule that binds a ligand,
   wherein the macromolecule is larger than 35 kiloDaltons; has a plurality of protons bound to positions on the macromolecule that are exposed to the second molecule; and the exposed protons can exchange with protons of the second molecule; comprising the steps of
   (a) performing the method of claim 1 to a first sample comprising the macromolecule and a second molecule;

(b) performing the method of claim 1 to a second sample comprising the macromolecule, the second molecule and a ligand; and (c) detecting a perturbation in the second sample compared to the first sample;

thereby indentifying the exposed position in the macromolecule that binds the ligand.

37. The method of claim 36, wherein the rate at which the ligand associates with the macromolecule is slower than or at most 10 fold higher than the rate at which the exposed protons of the macromolecule exchange with protons of the second molecule.

38. The method of claim 36, wherein the perturbation is a chemical shift change.

39. The method of claim 36, wherein the perturbation is reduced signal intensity.

40. The method of claim 36, wherein the perturbation is differential proton exchange between the first and second sample.

41. The method of claim 36, wherein a second ligand is bound to the macromolecule in the first sample in a position other than the binding position of the first ligand.

42. A method for identifying a position in a macromolecule that is differentially exposed to two ligands, wherein the macromolecule is larger than 35 kiloDaltons; has a plurality of protons bound to positions on the macromolecule that are exposed to a second molecule; and the exposed protons can exchange with protons of the second molecule; comprising the steps of (a) performing the method of claim 1 to a first sample comprising the macromolecule, the second molecule and a first ligand;

(b) performing the method of claim 1 to a second sample comprising the macromolecule, the second molecule and a second ligand; and (c) detecting a perturbation in the second sample compared to the first sample;

thereby identifying a position in the macromolecule that is differentially exposed in the presence of the first ligand compared to the second ligand.

43. The method of claim 42, wherein the rate at which the ligand associates with the macromolecule is slower than or at most 10 fold higher than the rate at which the exposed protons of the macromolecule exchange with protons of the second molecule.

44. The method of claim 42, wherein the perturbation is a chemical shift change.

45. The method of claim 42, wherein the perturbation is reduced signal intensity.

46. The method of claim 42, wherein the perturbation is differential proton exchange between the first and second sample.

47. The method of claim 42, wherein a second ligand is bound to the macromolecule in the first sample in a position other than the binding position of the first ligand.

* * * * *